United States Patent
Lee et al.

(10) Patent No.: US 9,960,169 B2
(45) Date of Patent: May 1, 2018

(54) METHODS OF MANUFACTURING SEMICONDUCTOR DEVICES

(71) Applicant: Samsung Electronics Co., Ltd., Suwon-si, Gyeonggi-do (KR)

(72) Inventors: Jun-Seok Lee, Suwon-si (KR); Byoung-Ho Kwon, Hwaseong-si (KR); Sang-Kyun Kim, Hwaseong-si (KR); Yun-Jeong Kim, Suwon-si (KR); Seung-Ho Park, Suwon-si (KR); Hao Cui, Suwon-si (KR); In-Seak Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/243,248

(22) Filed: Aug. 22, 2016

(65) Prior Publication Data

US 2017/0062437 A1     Mar. 2, 2017

(30) Foreign Application Priority Data

Sep. 1, 2015   (KR) .......................... 10-2015-0123309

(51) Int. Cl.
*H01L 27/108*   (2006.01)
*H01L 21/762*   (2006.01)
*H01L 21/3105*   (2006.01)

(52) U.S. Cl.
CPC .. *H01L 27/10873* (2013.01); *H01L 21/31053* (2013.01); *H01L 21/76224* (2013.01)

(58) Field of Classification Search
CPC ......... H01L 21/31055; H01L 21/32139; H01L 21/0337; H01L 21/31144; H01L 27/11582; H01L 21/0338; H01L 21/3212; C09K 3/146; C09G 1/02; C09G 1/04; C23F 3/00

See application file for complete search history.

(56) References Cited

U.S. PATENT DOCUMENTS

| | | | |
|---|---|---|---|
| 7,041,600 B2 | 5/2006 | Dokumaci et al. | |
| 7,273,816 B2 | 9/2007 | Sinha | |
| 7,378,348 B2 | 5/2008 | Shinmaru et al. | |
| 8,092,707 B2 | 1/2012 | Hardy et al. | |
| 8,685,857 B2 | 4/2014 | Matsui et al. | |
| 2004/0134873 A1 | 7/2004 | Yao et al. | |
| 2006/0024910 A1* | 2/2006 | Chatterjee | ....... H01L 21/823878 438/424 |
| 2007/0072375 A1* | 3/2007 | Yamazaki | ......... H01L 27/10876 438/270 |
| 2007/0117497 A1 | 5/2007 | Moeggenborg et al. | |

(Continued)

FOREIGN PATENT DOCUMENTS

| | | |
|---|---|---|
| JP | 2004-022748 | 1/2004 |
| JP | 5513384 B2 | 6/2014 |

(Continued)

*Primary Examiner* — Michael Carter
*Assistant Examiner* — Mohammed R Alam
(74) *Attorney, Agent, or Firm* — Ward & Smith, P.A.

(57) ABSTRACT

In a method of manufacturing a semiconductor device, mask patterns are formed on a semiconductor substrate. An organic layer is formed on the semiconductor substrate to cover the mask patterns. An upper portion of the organic layer is planarized using a polishing composition. The polishing composition includes an oxidizing agent and is devoid of abrasive particles.

6 Claims, 17 Drawing Sheets

(56) References Cited

U.S. PATENT DOCUMENTS

| | | | | |
|---|---|---|---|---|
| 2008/0134585 | A1* | 6/2008 | Brusic | C09G 1/02 |
| | | | | 51/308 |
| 2009/0039408 | A1* | 2/2009 | Hatano | H01L 21/76224 |
| | | | | 257/316 |
| 2010/0144153 | A1* | 6/2010 | Sills | G03F 7/0035 |
| | | | | 438/696 |
| 2011/0101339 | A1* | 5/2011 | Yamazaki | G11C 11/405 |
| | | | | 257/43 |
| 2011/0294293 | A1* | 12/2011 | Wang | B24B 37/044 |
| | | | | 438/692 |
| 2012/0094487 | A1 | 4/2012 | Kranz et al. | |
| 2012/0208346 | A1* | 8/2012 | Kadoshima | H01L 21/76229 |
| | | | | 438/425 |
| 2015/0008406 | A1* | 1/2015 | Furuie | H01L 51/5246 |
| | | | | 257/40 |
| 2015/0021513 | A1 | 1/2015 | Kim et al. | |
| 2016/0163833 | A1* | 6/2016 | He | H01L 29/7848 |
| | | | | 257/401 |

FOREIGN PATENT DOCUMENTS

| KR | 10-2006-0126970 A | 12/2006 |
|---|---|---|
| KR | 10-2014-0125316 A | 10/2014 |
| KR | 10-2015-0009914 A | 1/2015 |
| KR | 10-2015-0010570 A | 1/2015 |

* cited by examiner

METHODS OF MANUFACTURING SEMICONDUCTOR DEVICES

CROSS-REFERENCE TO RELATED APPLICATION

This application claims priority under 35 USC § 119 to Korean Patent Application No. 10-2015-0123309, filed on Sep. 1, 2015 in the Korean Intellectual Property Office (KIPO), the contents of which are incorporated by reference herein in its entirety.

FIELD

Example embodiments relate to methods of manufacturing semiconductor devices. More particularly, example embodiments relate to methods of manufacturing semiconductor devices including a polishing process.

BACKGROUND

In a fabrication of a semiconductor device, a chemical mechanical polish (CMP) process may be utilized for planarizing, e.g., an inorganic layer including silicon oxide, silicon nitride or a metal. The CMP process may be performed using a polishing pad and a CMP composition that may include abrasive particles, a dispersing agent, a deionized water, etc.

Various types of materials are employed in the semiconductor device, and a development of a process condition for the CMP process may be needed.

SUMMARY

Example embodiments provide a method of manufacturing a semiconductor device having improved mechanical and structural reliability.

According to example embodiments, there is provided a method of manufacturing a semiconductor device. In the method, mask patterns may be formed on a semiconductor substrate. An organic layer may be formed on the semiconductor substrate to cover the mask patterns. An upper portion of the organic layer may be planarized using a polishing composition. The polishing composition may include an oxidizing agent and may be devoid of abrasive particles.

In example embodiments, the organic layer may be formed of a polysilazane-based material, a polysiloxane-based material and/or a spin-on hardmask (SOH) material.

In example embodiments, the polishing composition may further include at least one of a surfactant, a pH adjusting agent or a polishing accelerator.

In example embodiments, the polishing composition may be devoid of a dispersing agent for abrasive particles.

In example embodiments, the method of manufacturing a semiconductor device, may include forming an organic layer on a semiconductor substrate to cover a mask pattern; and using a chemical mechanical polishing (CMP) process to planarize an upper portion of the organic layer, wherein the CMP process uses a polishing composition being devoid of abrasive particles. In some embodiments, the polishing composition includes an oxidizing agent. In some embodiments, the polishing composition consists essentially of deionized water, an oxidizing agent, a surfactant, and a pH adjusting agent. In some embodiments, the organic layer is formed of at least one of a polysilazane-based material, a polysiloxane-based material or a spin-on hardmask (SOH) material. In some embodiments, the polishing composition excludes cerium oxide.

In example embodiments, an upper portion of the semiconductor substrate may be etched using the mask patterns to form a trench. The organic layer may fill the trench.

In example embodiments, at least a portion of the mask patterns may serve as a bulk mask, and the organic layer may include a stepped portion protruding on the bulk mask.

In example embodiments, an object layer may be formed on the semiconductor substrate before forming the mask patterns. In forming the mask patterns, first organic layer patterns may be formed on the object layer. Spacers may be formed on sidewalls of the first organic layer patterns.

In example embodiments, the organic layer may fill spaces between the spacers.

In example embodiments, second organic layer patterns may be formed between the spacers by planarizing the upper portion of the organic layer.

In example embodiments, the spacers may be removed after forming the second organic layer patterns to form openings. The object layer may be etched through the openings.

According to example embodiments, there is provided a method of manufacturing a semiconductor device. In the method, active patterns defined by an isolation layer may be formed. A gate structure may be formed on the active patterns and the isolation layer. Impurity regions may be formed at upper portions of the active patterns adjacent to the gate structure. Conductive line structures electrically connected to some impurity regions of the impurity regions may be formed. An organic insulating interlayer may be formed on the isolation layer and the active patterns to cover the conductive line structures. An upper portion of the organic insulating interlayer may be planarized using a polishing composition. The polishing composition may include an oxidizing agent and may be devoid of abrasive particles.

In example embodiments, the organic insulating interlayer may be at least partially etched to form a contact hole through which at least one of the impurity regions except for the some impurity regions may be exposed. A contact may be formed in the contact hole.

In example embodiments, a capacitor may be formed on the contact.

In example embodiments, a peripheral circuit protection layer partially covering the active patterns and the isolation layer may be formed. The organic insulating interlayer may extend on the peripheral circuit protection layer, and may include a stepped portion protruding on the peripheral circuit protection layer.

In example embodiments, the gate structure may extend through upper portions of the active patterns and the isolation layer.

In example embodiments, the organic layer may be formed of a polysilazane-based material, a polysiloxane-based material and/or a spin-on hardmask (SOH) material.

According to example embodiments, there is provided a method of manufacturing a semiconductor device. In the method, mask patterns may be formed on a semiconductor substrate. An upper portion of the semiconductor substrate may be etched through the mask patterns to form an isolation trench. An organic layer filling the trench and covering the mask patterns may be formed. An upper portion of the organic layer may be planarized using a polishing composition until the mask patterns may be exposed to form an isolation layer. The polishing composition may include an oxidizing agent, and may be devoid of abrasive particles.

In example embodiments, the isolation layer may be thermally treated.

In example embodiments, the mask patterns and an upper portion of the isolation layer may be removed by a polishing process.

In example embodiments, a polishing composition for the polishing process may include abrasive particles.

BRIEF DESCRIPTION OF THE DRAWINGS

Example embodiments will be more clearly understood from the following detailed description taken in conjunction with the accompanying drawings.

FIGS. 1 to 5 are cross-sectional views illustrating a method of manufacturing a semiconductor device in accordance with example embodiments;

FIGS. 6 to 14 are cross-sectional views illustrating a method of manufacturing a semiconductor device in accordance with example embodiments; and FIGS. 15 to 25 are top-plan views and cross-sectional views illustrating a method of manufacturing a semiconductor device in accordance with example embodiments.

DESCRIPTION OF EMBODIMENTS

Figure 1:
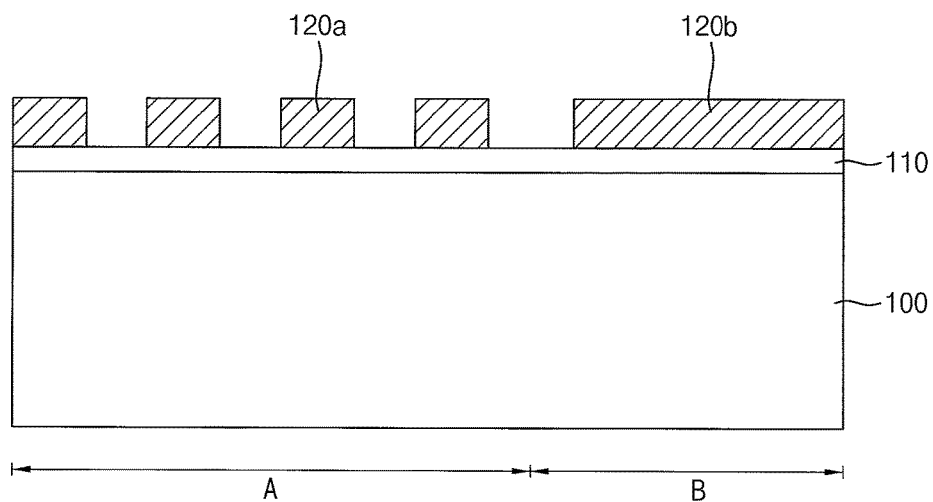
FIGS. 1 to 25 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 5 are cross-sectional views illustrating a method of manufacturing a semiconductor device in accordance with example embodiments.

For example, FIGS. 1 to 5 illustrate a device isolation process, e.g., a shallow trench isolation (STI) process.

Referring to FIG. 1, a pad oxide layer 110, and mask patterns 120a and 120b may be formed on a substrate 100.

A semiconductor substrate, e.g., a silicon substrate, a germanium substrate, a silicon-germanium substrate, a silicon-on-insulator (SOI) substrate, a germanium-on-insulator (GOI) substrate, etc., may be used as the substrate 100. The substrate 100 may include a group III-V compound, e.g., InP, GaP, GaAs, GaSb, etc. A well including p-type or n-type impurities may be formed at an upper portion of the substrate.

In example embodiments, the substrate 100 may be divided into a first region A and a second region B. The second region B may correspond to a peripheral region of the substrate 100 adjacent to the first region A. In some embodiments, the first region A may be allotted as a device region at which a memory device and/or a logic device may be formed. The second region B may be allotted as a peripheral circuit region.

The pad oxide layer 110 may be formed of silicon oxide. In some embodiments, the pad oxide layer 110 may be formed by performing a thermal oxidation process on a top surface of the substrate 100. Alternatively, the pad oxide layer 110 may be formed by a deposition process, e.g., a chemical vapor deposition (CVD) process, a sputtering process, an atomic layer deposition (ALD) process, a physical vapor deposition (PVD) process, etc.

A mask layer may be formed on the pad oxide layer 110, and the mask layer may be patterned by a photo-lithography process to form the mask patterns 120a and 120b. The mask layer may be formed of silicon nitride by, e.g., a CVD process or a PVD process.

The mask patterns may include a first mask pattern 120a and a second mask pattern 120b formed at the first region A and the second region B, respectively.

A plurality of openings through which a top surface of the pad oxide layer 110 is exposed may be formed in the first mask pattern 120a or between the first mask patterns 120a. The second mask pattern 120b may be provided as a bulk mask continuously or entirely covering the second region B of the substrate 100. For example, the second mask pattern 120b may not include openings as those of the first mask pattern 120a.

Figure 2:
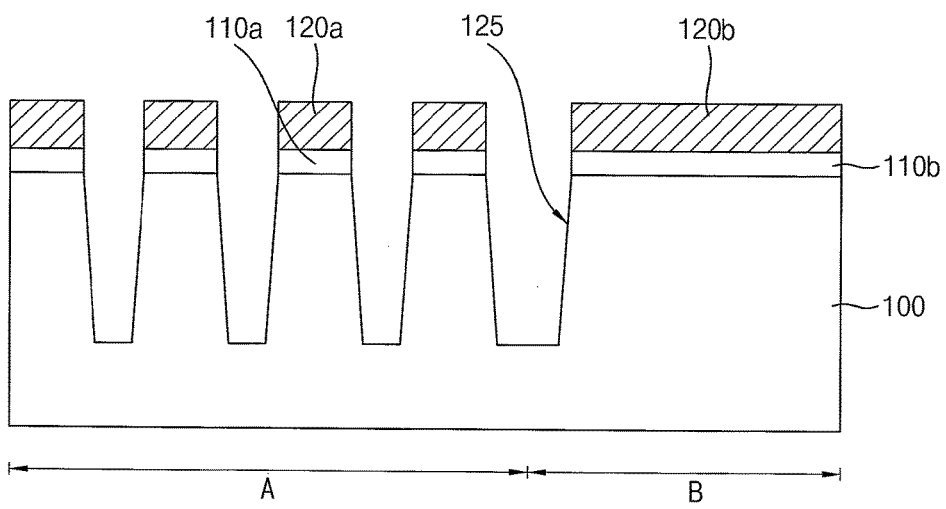

Referring to FIG. 2, the pad oxide layer 110 and an upper portion of the substrate 100 may be partially etched using the mask patterns 120a and 120b as etching masks. Accordingly, a first pad oxide pattern 110a and a second pad oxide pattern 110b may be formed under the first mask pattern 110a and the second mask pattern 120b, respectively. A trench 125 may be formed at the upper portion of the substrate 100.

In example embodiments, a plurality of trenches 125 may be formed at the first region A of the substrate 100. The trench 125 may be also formed at a boundary between the first region A and the second region B (e.g., between the first mask pattern 120a and the second mask pattern 120b).

Figure 3:
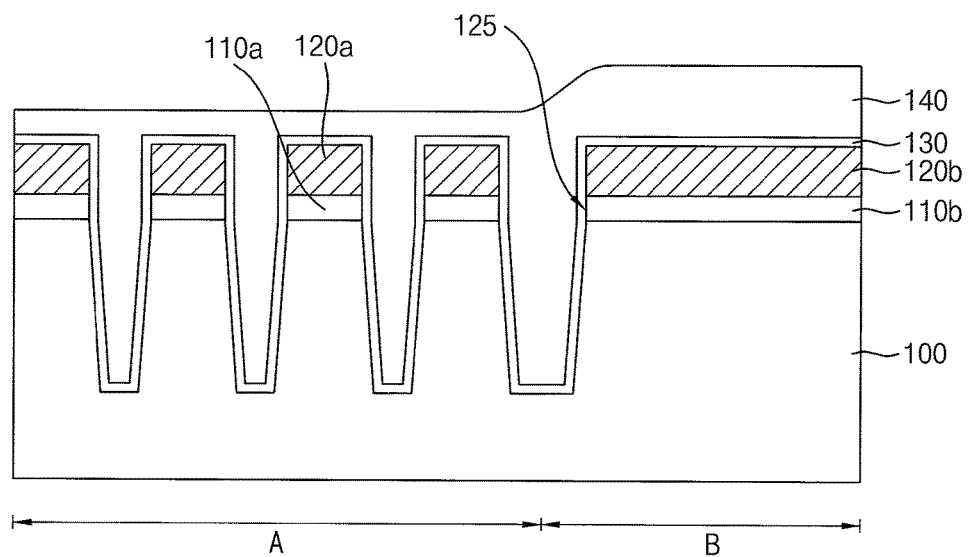

Referring to FIG. 3, a liner 130 may be formed along inner walls of the trenches 125, and surfaces of the pad oxide patterns 110a and 110b, and the mask patterns 120a and 120b. An organic layer 140 sufficiently filling the trenches 125 and covering the mask patterns 120a and 120b may be formed on the liner 130.

In example embodiments, the liner 130 may be formed of silicon oxide by, e.g., a CVD process, a PVD process, and ALD process, a sputtering process, etc. In some embodiments, the liner 130 may be formed by performing a thermal oxidation process on the inner wall of the trench 125. In this case, the liner 125 may be formed selectively on the inner wall of the trench 125.

In some embodiments, an additional liner including a nitride may be formed on the liner 130 or on the inner wall of the trench 125.

The organic layer 140 may include an organic material such as a siloxane-based material (e.g., polydimethylsiloxane), polysilazane or a spin-on hardmask (SOH) material. A carbon-based SOH material may be used as the SOH material. The organic layer 140 may be formed using the organic material by, e.g., a spin coating process.

In example embodiments, the organic layer 140 may include a stepped portion at the second region B of the substrate 100. For example, a top surface of the organic layer 140 at the second region B may be higher than that at the first region A due to the second mask pattern 120b continuously covering a relatively large area.

Figure 4:
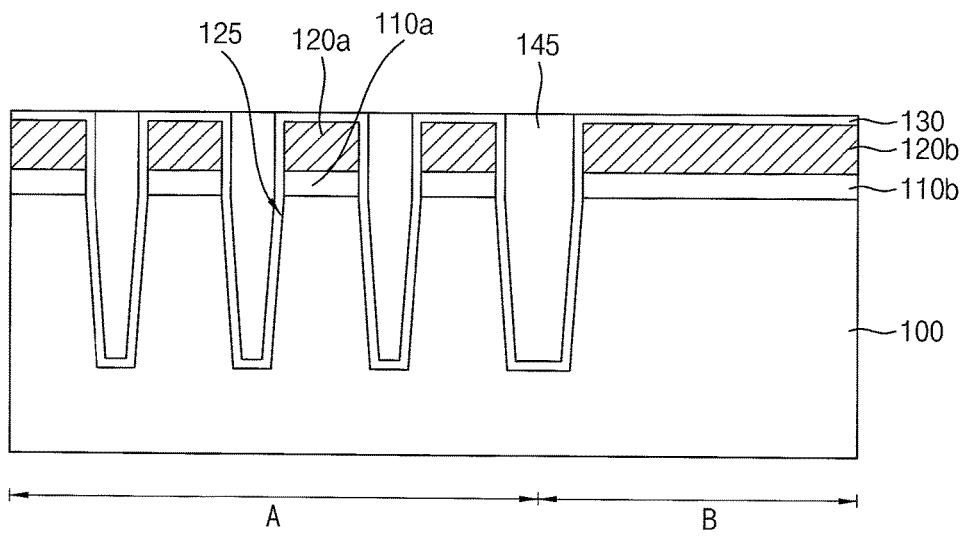

Referring to FIG. 4, an upper portion of the organic layer 140 may be planarized using a polishing composition to form an organic layer pattern 145 filling each trench 125. The organic layer pattern 145 may serve as an isolation layer of a semiconductor device.

The polishing composition may be used for performing a chemical mechanical polish (CMP) process.

In example embodiments, the polishing composition may not include abrasive particles such as ceria (or cerium oxide) particles. In some embodiments, the polishing composition may include an oxidizing agent and a surfactant, and may include a deionized water as a solvent. The abrasive particles may be excluded from the polishing composition. The polishing composition may further include a pH adjusting agent and a polishing accelerator.

A surface of the organic layer 140 may be oxidized by the oxidizing agent to form a substantially hydrophilic surface, and a desired polishing rate may be obtained. Examples of the oxidizing agent may include peroxide such as hydrogen peroxide, permanganate, chromate, dichromate, nitrate, a peroxy acid compound, a metal oxide (e.g., lead dioxide or manganese dioxide), chlorate, chlorite, perchlorate, or the like. These may be used alone or in a combination thereof.

A wettability of the organic layer 140 may be improved by the surfactant, and the polishing rate may be improved by a combination of the oxidizing agent and the surfactant. Examples of the surfactant may include a polysorbate-based compound, a polyethylene glycol-based compound, a sulfonate-based compound, a stearate-based compound, a laurate-based compound, or the like. These may be used alone or in a combination thereof.

In some embodiments, a pH value of the polishing composition may be controlled by the pH adjusting agent. If the pH value of the polishing composition is excessively low, other layers including, e.g., a metal layer, a nitride layer, etc., may be damaged or corroded. If the pH value of the polishing composition is excessively large, an oxidation of the organic layer 140 may be delayed to result in a reduction of the polishing rate. In some example embodiments, the pH value of the polishing composition may be controlled in a range from about 3 to about 6 by the pH adjusting agent.

For example, the pH adjusting agent may include an organic acid such as formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid, etc., or a salt thereof. These may be used alone or in a combination thereof.

In some embodiments, the polishing rate may be further improved by adding the polishing accelerator. The polishing accelerator may function for decomposing or weakening carbon bonds included in the organic layer 140. The polishing accelerator may include, e.g., an inorganic acid such as sulfuric acid, nitric acid, sulfonic acid, etc., or a salt thereof. These may be used alone or in a combination thereof.

For example, the polishing composition may include about 0.1 weight percent (wt %) to about 10 wt % of the oxidizing agent, about 0.05 wt % to about 5 wt % of the surfactant, about 0.05 wt % to about 5 wt % of the pH adjusting agent, about 0.05 wt % to about 5 wt % of the polishing accelerator and a remainder of the deionized water based on a total weight of the composition. In some embodiments, the polishing composition may be devoid of the abrasive particles, and may comprise, consist essentially of, or consist of the components as described above.

The CMP process using the polishing composition may be performed under process conditions different from those of a CMP process using abrasive particles. For example, the CMP process using the polishing composition according to example embodiments may be performed with a polishing time, a polishing pressure and a polishing plate rotating speed greater than those for the CMP process using the abrasive particles.

In some embodiments, a predetermined amount of the abrasive particles may be added to the polishing composition according to example embodiments to prepare a CMP composition of a comparative example. A polishing time, a polishing pressure and a polishing plate rotating speed for polishing an organic layer without damaging a polish-stop layer (e.g., the liner 130 or the mask patterns 120a and 120b) may be measured from the CMP composition of the comparative example. The CMP process using the polishing composition according to example embodiments may be performed under process conditions of about 1.5 times to about 3 times each of the polishing time, the polishing pressure and the polishing plate rotating speed measured above. Thus, a reduction of the polishing rate due to an exclusion of the abrasive particles may be compensated by controlling the process conditions as described above.

In the comparative example, mechanical defects such as scratches, dimples and/or delamination of the organic layer 140 having a relatively low hardness may be caused by the abrasive particles. As illustrated in FIG. 3, the mechanical defects may be exacerbated at a portion of the organic layer 140 having a low top surface (e.g., at the first region A). Further, the abrasive particles may be diffused into the organic layer 140 to degrade a layer quality. If the abrasive particles are included in the CMP composition, a dispersing agent for uniform dispersion of the abrasive particles may be further needed. For example, a polymer such as polyacrylic acid may be used as the dispersing agent. The polymer may cover the organic layer 140 to hinder a polishing process, and may cause an aggregation of the abrasive particles.

However, according to example embodiments, the abrasive particles may be excluded from the polishing composition, and the organic layer 140 may be polished by an interaction of the oxidizing agent, the surfactant, the pH adjusting agent, etc. Thus, the organic layer pattern 145 having a substantially leveled or planar top surface may be formed without defects of a surface of the organic layer 140. Further, the dispersing agent may be excluded from the polishing composition because of a lack of the abrasive particles. Thus, the above-mentioned problems caused by the dispersing agent may be avoided.

Figure 5:
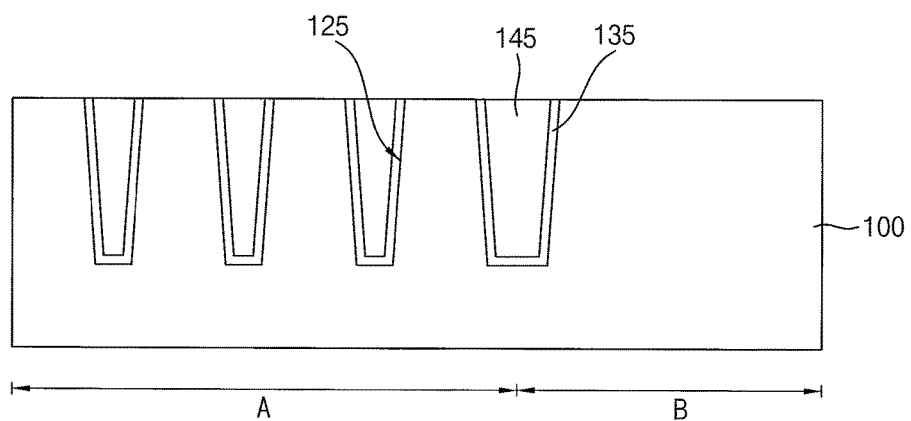

Referring to FIG. 5, an additional polishing process or an etch-back process may be performed to remove upper portions of the liner 130 and the organic layer pattern 145, the mask patterns 120a and 120b, and the pad oxide patterns 110a and 110b. Accordingly, the top surface of the substrate 100 may be exposed, and a liner pattern 135 and the organic layer pattern 145 may be formed in each trench 125.

In some embodiments, the additional polishing process may be performed using a polishing composition that may include abrasive particles.

In some embodiments, a thermal treatment may be performed on the organic layer pattern 145. The organic layer pattern 145 may be modified into an isolation layer having a substantial silicate structure.

FIGS. 6 to 14 are cross-sectional views illustrating a method of manufacturing a semiconductor device in accordance with example embodiments. For example, FIGS. 6 to 14 illustrate a double patterning process for forming a fine pattern of a semiconductor device.

Figure 6:
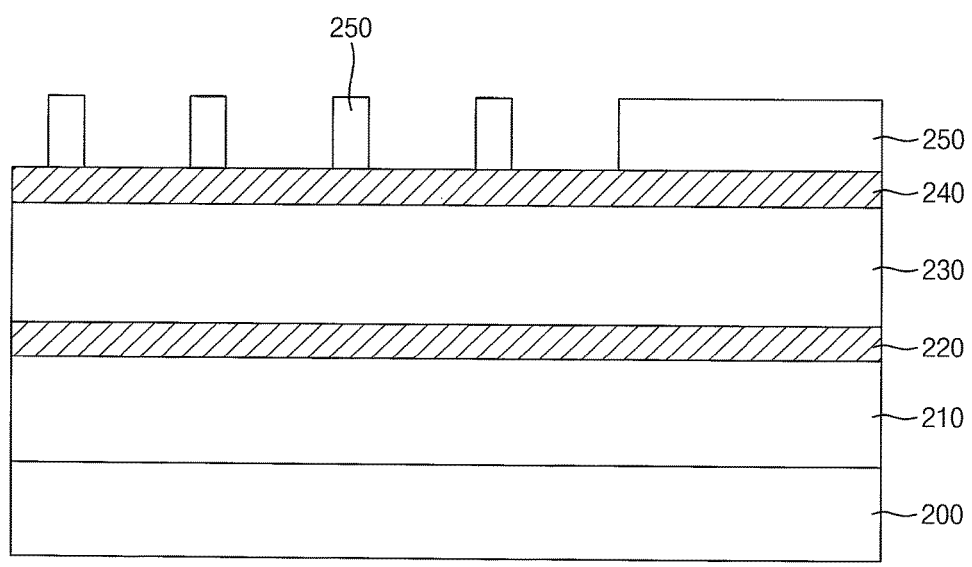

Referring to FIG. 6, an object layer 210, a lower mask layer 220, a first organic layer 230 and an upper mask layer 240 may be sequentially formed on a substrate. A photoresist pattern 250 may be formed on the upper mask layer 240.

A semiconductor substrate, e.g., a silicon substrate, a germanium substrate, a silicon-germanium substrate, an SOI substrate, a 00G substrate, etc., may be used as the substrate 200. The substrate 200 may include a group III-V compound, e.g, InP, GaP, GaAs, GaSb, etc.

The object layer 210 may be transformed into the fine pattern by the double patterning process. For example, the object layer 210 may be partially etched by the double patterning process to include fine holes.

In example embodiments, the object layer 210 may be formed of an insulation material, e.g., silicon oxide. In some embodiments, the object layer 210 may be formed of a conductive material such as a metal, a metal nitride, a metal silicide and/or a metal silicide nitride, or a semiconductor material such as polysilicon.

The lower mask layer 220 and the upper mask layer 240 may be formed of a material having a sufficient etching selectivity with respect to the object layer 210. For example, the lower mask layer 220 and the upper mask layer 240 may be formed of silicon nitride or silicon oxynitride.

In some embodiments, at least one of the lower mask layer 220 and the upper mask layer 240 may be omitted.

The object layer 210, the lower mask layer 220 and the upper mask layer 240 may be formed by a deposition process, e.g., a CVD process, an ALD process, a sputtering process, etc.

In example embodiments, the first organic layer 230 may be formed using a carbon-based SOH material by a spin coating process.

The photoresist pattern 250 may have a narrow width and/or a narrow area at a region for performing the double patterning process, and may have a relatively large width and/or a relatively large area at a region in which the double patterning process is not involved.

For example, a portion of the photoresist pattern 250 illustrated in a right region of FIG. 6 may substantially cover the region in which the double patterning process may not be involved. In some embodiments, the portion of the photoresist pattern 250 may entirely cover the region in which the double patterning process may not be involved.

Figure 7:
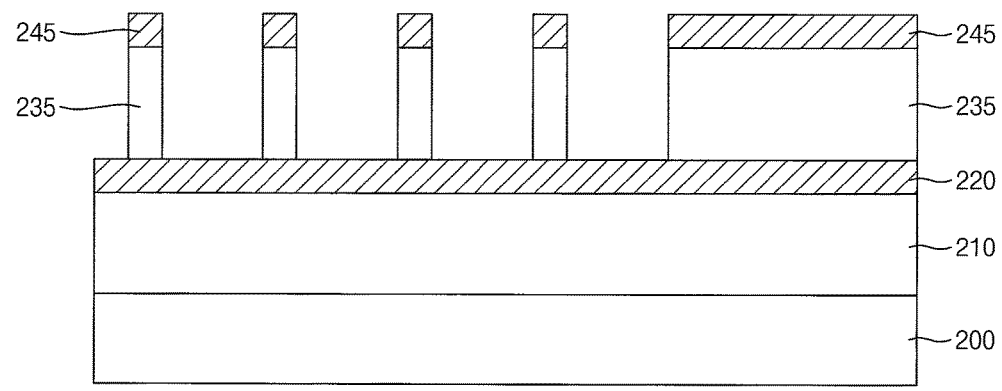

Referring to FIG. 7, the upper mask layer 240 and the first organic layer 230 may be partially etched by, e.g., a dry etching process using the photoresist pattern 250. Accordingly, a stacked structure including a first organic layer pattern 235 and an upper mask pattern 245 may be formed on the lower mask layer 220. The photoresist pattern 250 may be removed by, e.g., an ashing process and/or a strip process.

The first organic pattern 235 and/or the upper mask pattern 245 illustrated in a right region of FIG. 7 may serve as a bulk mask covering a relatively large area.

Figure 8:
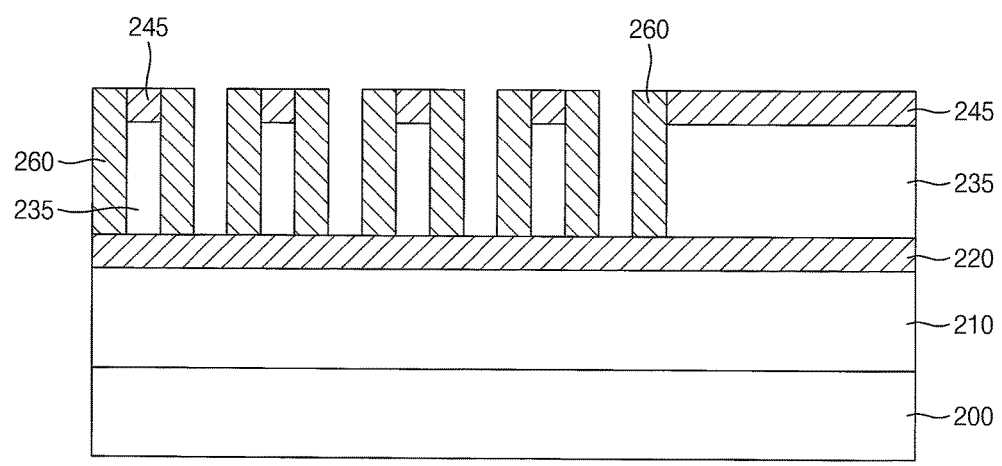

Referring to FIG. 8, a spacer 260 may be formed on sidewalls of the first organic layer pattern 235 and the upper mask pattern 245.

In example embodiments, a spacer layer may be formed on the lower mask layer 220 and conformally along surfaces of the first organic layer pattern 235 and the upper mask pattern 245. The spacer layer may be partially removed by an anisotropic etching process or an etch-back process to form the spacer 260.

The spacer 260 may be formed on both sidewalls of the first organic layer pattern 235, and two spacers 260 may be formed between the neighboring first organic layer patterns 235.

For example, the spacer layer may be formed of silicon oxide by and ALD process.

Figure 9:
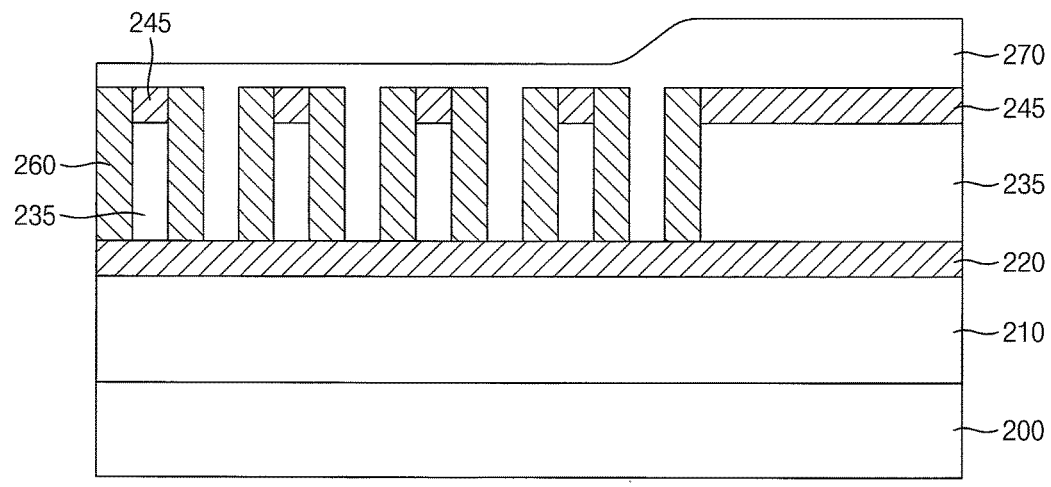

Referring to FIG. 9, a second organic layer 270 covering the spacers 260 and the upper mask pattern 245 may be formed on the lower mask layer 220.

The second organic layer 270 may sufficiently fill spaces between the neighboring spacers 260, and may cover the first organic layer patterns 235 or the upper mask patterns 245. In example embodiments, the second organic layer 270 may be formed of a material substantially the same as or similar to that of the first organic layer 230. For example, the second organic layer 270 may be formed of a carbon-based SOH material.

As illustrated in FIG. 9, the second organic layer 270 may include a protrusion or a stepped portion on the first organic layer pattern 235 or the upper mask pattern 245 serving as the bulk mask.

Figure 10:
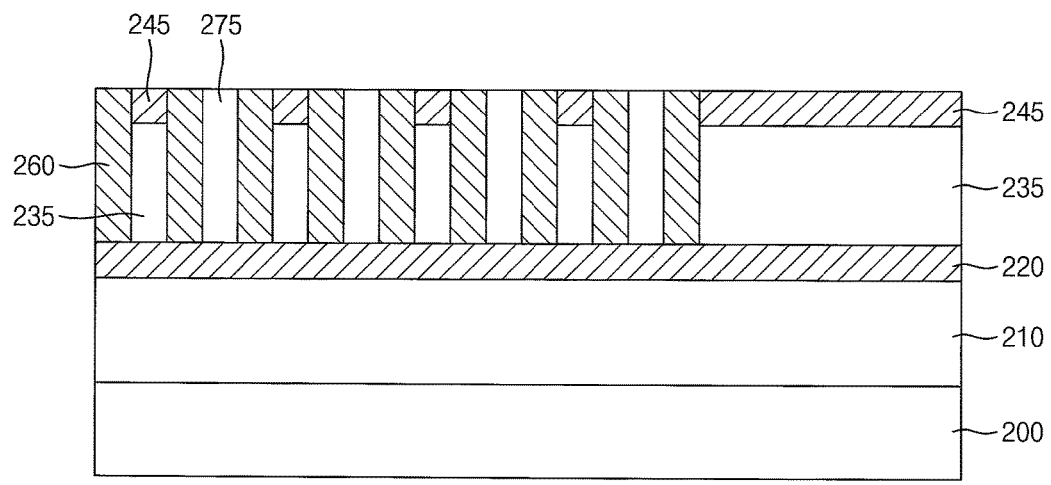

Referring to FIG. 10, an upper portion of the second organic layer 270 may be planarized to form a second organic layer pattern 275.

In example embodiments, a CMP process using the polishing composition described with reference to FIG. 4 may be performed to planarize the second organic layer 270 until top surfaces of the spacer 260 and/or the upper mask pattern 245.

After the CMP process, the second organic layer pattern 275 may be formed between the neighboring spacers 260. The first organic layer patterns 235 and the second organic layer patterns 275 may be spaced apart by the spacers 260, and may be arranged alternately and repeatedly along a horizontal direction.

As described above, the polishing composition may be devoid of abrasive particles, and may include an oxidizing agent, a surfactant, a pH adjusting agent and a polishing accelerator. Thus, the second organic layer patterns 275 having a substantially planar or leveled top surface and being free of defects such as scratches and dimples may be formed. The CMP process may be performed with a polishing rate, a polishing pressure and/or a polishing plate rotating speed greater than those in a CMP process using a composition with abrasive particles.

Figure 11:
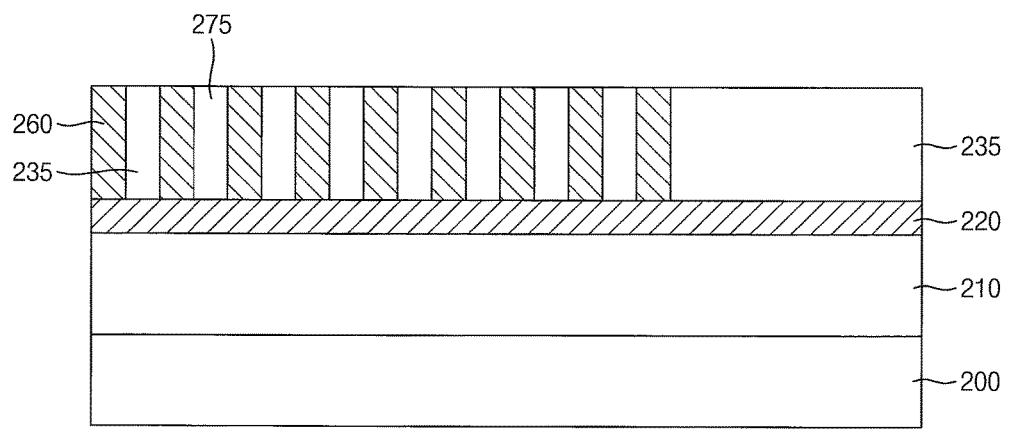

Referring to FIG. 11, an additional CMP process may be performed to remove upper portions of the spacers 260 and the second organic layer patterns 275. In some embodiments, the additional CMP process may be performed until the upper mask patterns 245 may be removed. After the additional CMP process, top surfaces of the first organic layer pattern 235 and the second organic layer pattern 275 may be substantially coplanar with each other.

In some embodiments, the additional CMP process may be performed using a polishing composition that may include abrasive particles.

Figure 12:
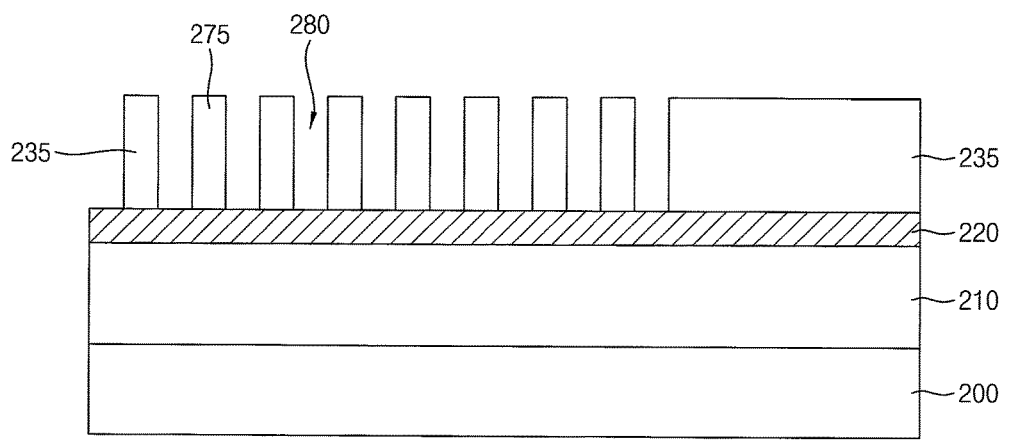

Referring to FIG. 12, the spacers 260 may be removed. In some embodiments, an etchant solution having an etching selectivity for silicon oxide may be used for removing the spacers 260. The etchant solution may include, e.g., a fluoric acid solution or a buffer oxide etchant (BOE) solution.

The first organic layer patterns 235 and the second organic layer patterns 275 spaced apart from each other may remain on the lower mask layer 220 after removing the spacers 260.

A preliminary opening 280 may be formed between the first organic layer pattern 235 and the second organic layer pattern 275 neighboring each other. The preliminary opening 280 may have a hole shape or a trench shape extending linearly.

Figure 13:
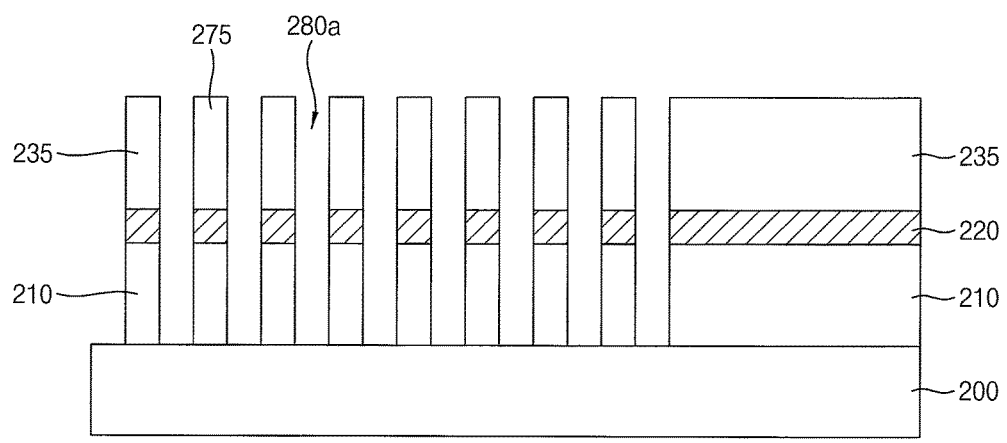

Referring to FIG. 13, the lower mask layer 220 and the object layer 210 may be partially removed using the first and second organic layer patterns 235 and 275 as etching masks. Accordingly, an opening 280a expanding from the preliminary opening 280 may be formed in the object layer 210.

Figure 14:
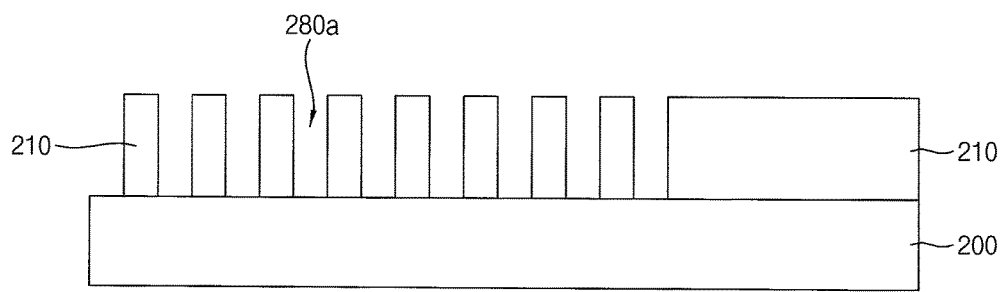

Referring to FIG. 14, the first and second organic layer patterns 235 and 275, and the lower mask layer 220 may be removed. Accordingly, the object layer 210 including the openings 280a of a target fine dimension may remain on the substrate 200.

For example, the first and second organic layer patterns 235 and 275 may be removed by an ashing process and/or a strip process. The lower mask layer 220 may be removed using an etchant solution that may have an etching selectivity for a nitride, e.g., phosphoric acid or nitric acid.

In some embodiments, a circuit structure of a semiconductor device, e.g., a contact, a plug or a wiring may be formed in the opening 280a. In some embodiments, if the object layer 210 includes a conductive material, the object layer 210 may be etched by the above-described double patterning process to be converted into the circuit structure.

As described above, a double patterning process using an organic material such as an SOH material may include a polishing process using the polishing composition according to example embodiments. Thus, an organic layer pattern including the SOH material and serving as an etching mask may have an improved surface profile, and a target pattern having a desired fine dimension may be formed with high reliability.

Figure 15:
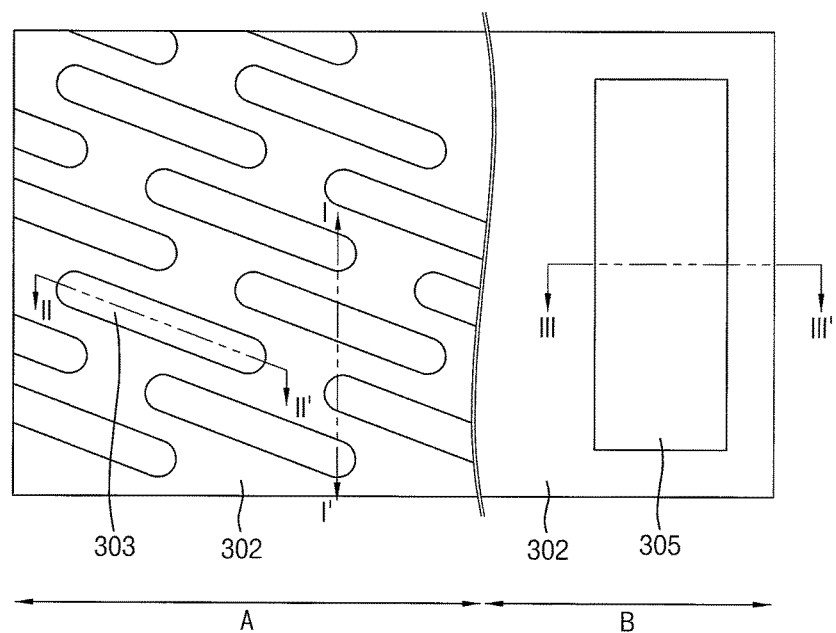
Figure 16:
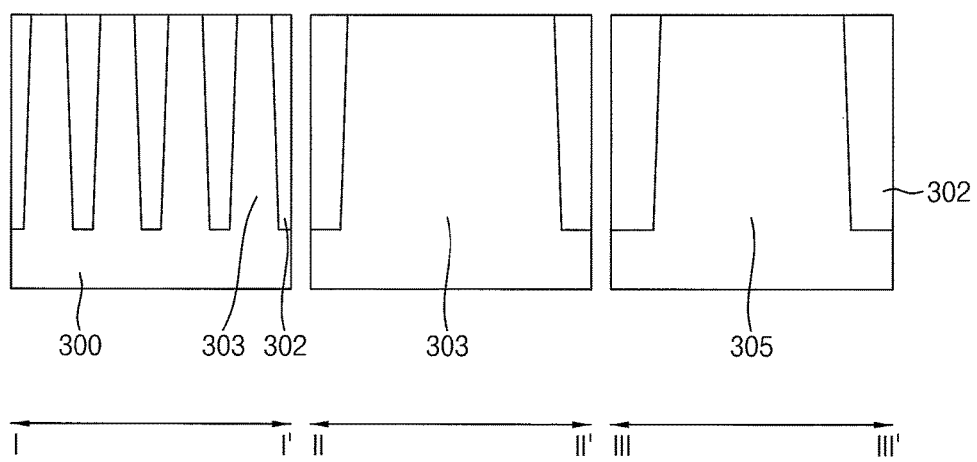
Figure 17:
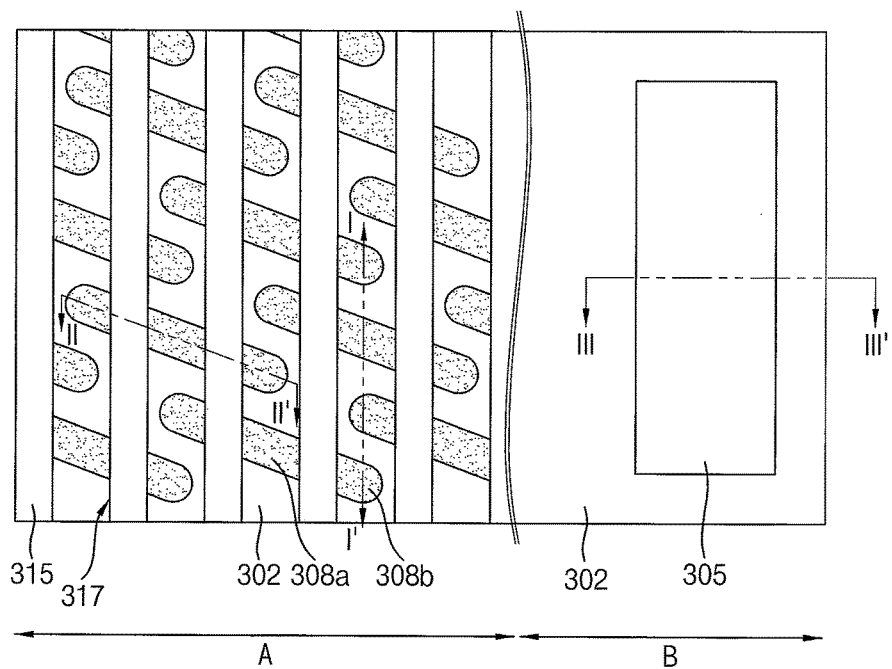

FIGS. 15 to 25 are top-plan views and cross-sectional views illustrating a method of manufacturing a semiconductor device in accordance with example embodiments. Specifically, FIGS. 15 and 17 are top plan views illustrating the method. FIG. 16, and FIGS. 18 to 25 include sub-cross sectional views taken along lines I-I', II-II' and III-III' indicated in FIGS. 15 and 17.

For example, FIGS. 15 to 25 illustrate a method of manufacturing a dynamic random access memory (DRAM) device including a buried cell transistor array (BCAT) structure.

Referring to FIGS. 15 and 16, an upper portion of a substrate 300 may be etched to form an isolation layer 302 defining active patterns 303 and 305.

The substrate 300 may be divided into a first region A and a second region B. The first region A and the second region B may be allotted as, e.g., a device region and a peripheral circuit region, respectively.

In example embodiments, the active patterns 303 and 305, and the isolation layer 302 may be formed by an STI process substantially the same as or similar to that illustrated with reference to FIGS. 1 to 5.

For example, a first mask pattern (not illustrated) and a second mask pattern (not illustrated) may be formed on the first region A and the second region B, respectively. The upper portion of the substrate 300 may be etched using the mask patterns to form isolation trenches. The second mask pattern may have a plate shape continuously covering a relatively large area.

Subsequently, an organic layer sufficiently filling the isolation trenches and covering the mask patterns may be formed. The organic layer may include a stepped portion on the second mask pattern formed at the second region B.

The organic layer may be planarized by a CMP process substantially the same as or similar to that illustrated with reference to FIG. 4 until top surfaces of the mask patterns may be exposed to form the isolation layer 302. The polishing composition according to example embodiments may be utilized in the CMP process. The polishing composition may be substantially devoid of abrasive particles, and may include an oxidizing agent, a surfactant, a pH adjusting agent and/or a polishing accelerator. Thus, the isolation layer 302 having a substantially leveled or planar top surface and being substantially free of defects such as scratches and dimples may be formed. The CMP process may be performed with a polishing rate, a polishing pressure and/or a polishing plate rotating speed greater than those in a polishing process using a composition that includes the abrasive particles.

An additional CMP process may be performed to planarize the mask patterns and an upper portion of the isolation layer 302 until top surfaces of the active patterns 303 and 305 may be exposed. A polishing composition used in the additional CMP process may include the abrasive particles.

The active patterns may include a first active pattern 303 and a second active pattern 305 protruding from lower portions of the substrate 300 at the first region A and the second region B, respectively.

The first active pattern 303 may extend diagonally to a first direction and a second direction that may be parallel to a top surface of the substrate 300 and may cross each other. A plurality of the first active patterns 303 may be arranged along the first and second directions at the first region A.

The second active pattern 305 may have, e.g., a plate shape as illustrated in FIG. 15.

Figure 18:
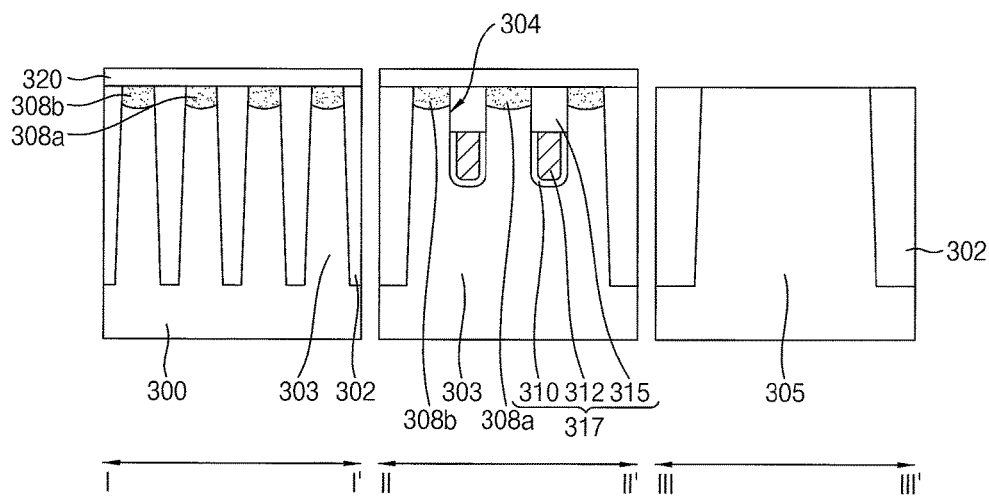

Referring to FIGS. 17 and 18, a transistor including a first gate structure 317 and impurity regions 308a and 308b may be formed at the first region A of the substrate 300.

In example embodiments, gate trenches 304 extending through upper portions of the first active pattern 303 and the isolation layer 302 may be formed. For example, the gate trench 304 may extend in the first direction, and a plurality of the gate trenches 304 may be formed along the second direction at the first region A. In some embodiments, two gate trenches 304 may be formed at each first active pattern 303.

For example, a thermal oxidation process may be performed on surfaces of the first active patterns 303 exposed by the gate trench 304 to form a first gate insulation layer. Alternatively, silicon oxide or a metal oxide may be deposited by, e.g., a CVD process on the surfaces of the first active patterns 303 to form the gate insulation layer.

A first gate conductive layer filling the gate trenches 304 may be formed on the first gate insulation layer. The first gate conductive layer and the first gate insulation layer may be planarized by a CMP process until the top surface of the first active pattern 303 may be exposed, and an upper portion of the first gate conductive layer formed in the gate trench 304 may be partially removed by an etch-back process. Accordingly, a first gate insulation pattern 310 may be formed in an inner wall of the gate trench 304, and a first gate electrode 312 filling a lower portion of the gate trench 304 may be formed on the first gate insulation pattern 310.

The first gate conductive layer may be formed of, e.g., a metal and/or a metal nitride by an ALD process or a sputtering process.

A first gate mask layer filling a remaining portion of the gate trench 304 may be formed on the first gate insulation pattern 310 and the first gate electrode 312. An upper portion of the first gate mask layer may be planarized until the top surface of the first active pattern 303 may be exposed to from a first gate mask 315. The first gate mask layer may be formed of, e.g., silicon nitride by a CVD process.

Accordingly, the first gate structure 317 including the first gate insulation pattern 310, the first gate electrode 312 and the first gate mask 315 sequentially stacked in the gate trench 304 may be formed.

According to the arrangement of the gate trenches 304 as described above, the first gate structure 317 may extend in the first direction, and a plurality of the gate structures 317 may be formed along the second direction.

An ion-implantation process may be performed to form the impurity regions 308a and 308b at an upper portion of the first active pattern 303 adjacent to the first gate structure 317. Accordingly, e.g., a buried cell array transistor (BCAT) structure including the first gate structure 317 and the impurity regions 308a and 308b may be formed at the first region A of the substrate 300.

The impurity regions may include a first impurity region 308a and a second impurity region 308b. The first impurity region 308a may be formed at a central portion of the first active pattern 303 between the two first gate structures 317. The second impurity region 308b may be formed at a peripheral portion of the first active pattern 303, and may face the first impurity region 308a with respect to the first gate structure 317.

As illustrated in FIG. 18, one first impurity region 308a and two second impurity regions 308b may be formed at one first active pattern 303.

Subsequently, a capping layer 320 covering the isolation layer 302, the first and second impurity regions 308a and 308b, and the first gate structure 317 may be formed selectively on the first region A. The capping layer 320 may be formed of, e.g., silicon nitride or silicon oxynitride.

Figure 19:
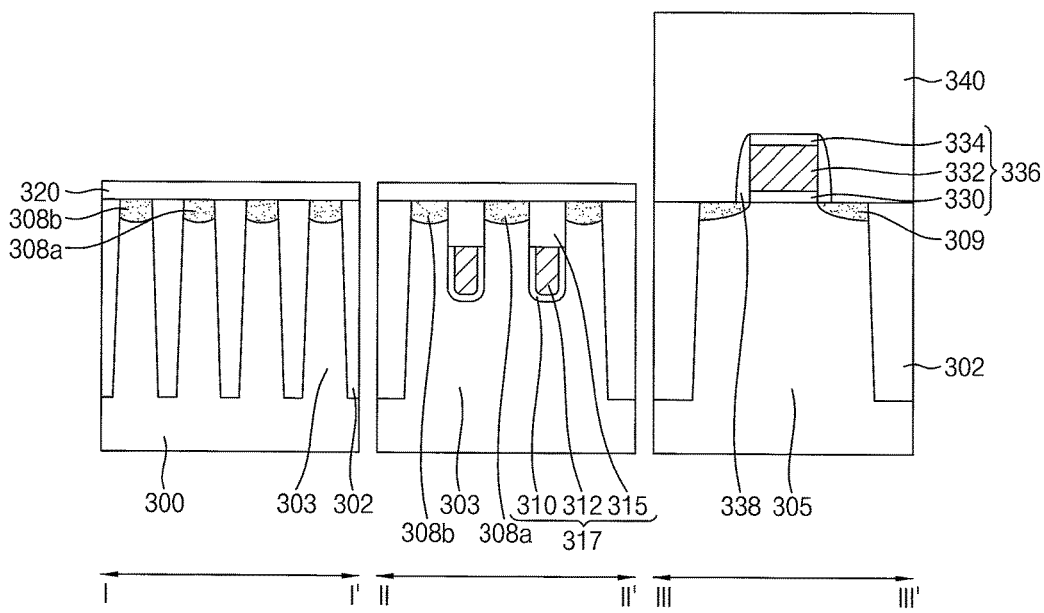

Referring to FIG. 19, a second gate structure 336 may be formed on the second active pattern 305.

In example embodiments, a second gate insulation layer, a second gate conductive layer and a second gate mask layer may be sequentially formed on the second active pattern 305 and the isolation layer 302, and may be patterned by a photo-lithography process to form the second gate structure 336 including a second gate insulation pattern 330, a second gate electrode 332 and a second gate mask 334.

Impurities may be implanted at an upper portion of the second active pattern 305 using the second gate structure 336 as an ion-implantation mask to form a second impurity region 309. Accordingly, a peripheral circuit transistor including the second gate structure 336 and the second impurity region 309 may be formed at the second region B.

A gate spacer 338 may be further formed on a sidewall of the second gate structure 336. For example, a spacer layer including silicon nitride and covering the second gate structure 336 may be formed, and then may be anisotropically etched to form the gate spacer 338.

In example embodiments, a peripheral circuit protection layer 340 covering the peripheral circuit transistor may be formed on the second region B of the substrate 300. For example, a protection layer covering the peripheral circuit transistor may be formed on the capping layer 320, the isolation layer 302 and the second active pattern 305. A portion of the protection layer formed on the first region A may be removed to form the peripheral circuit protection layer 340.

The protection layer may be formed of a silicon oxide-based material such as plasma enhanced oxide (PEOX), tetraethyl orthosilicate (TEOS) or flowable oxide (FOX), etc., by a CVD process.

Figure 20:
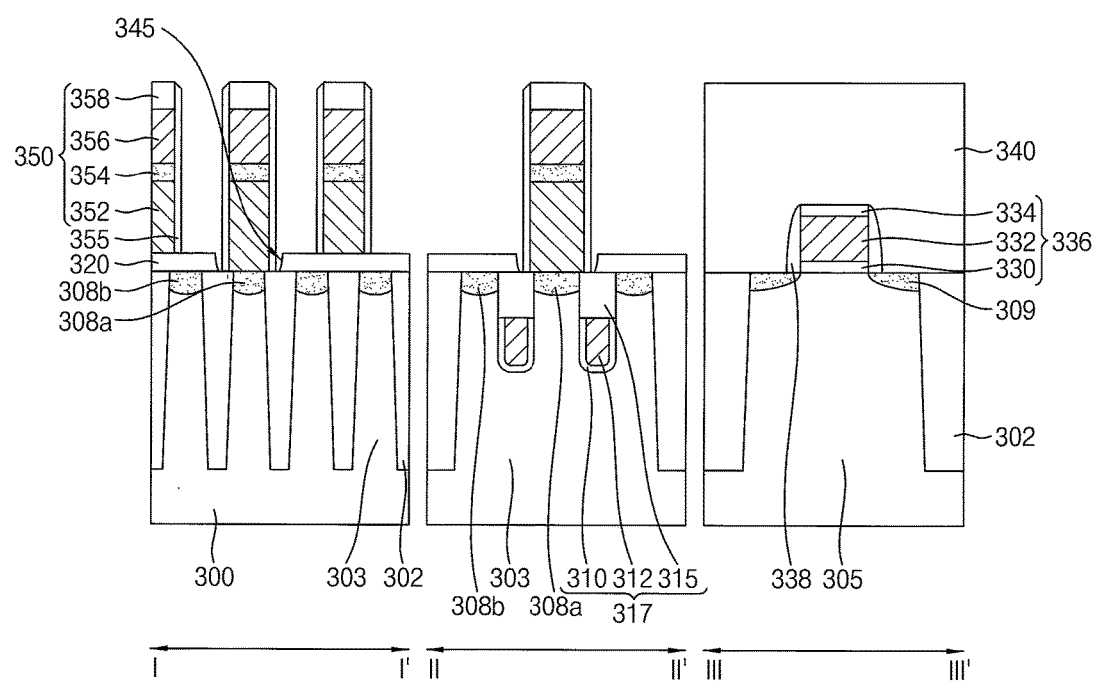

Referring to FIG. 20, a conductive line structure 350 electrically connected to the first impurity region 308a may be formed on the first region A of the substrate 300.

In example embodiments, the capping layer 320 may be partially etched to form a groove 345 through which the first impurity regions 308a may be exposed. The groove 345 may extend in the second direction, and a plurality of the grooves 345 may be formed to be arranged along the first direction.

A first conductive layer filling the grooves 345 may be formed on the capping layer 345. A barrier conductive layer and a second conductive layer may be sequentially formed on the first conductive layer, and a mask pattern 358 may be formed on the second conductive layer.

For example, the first conductive layer may be formed using doped polysilicon, the barrier conductive layer may be formed of a metal nitride or a metal silicide nitride, and the second conductive layer may be formed using a metal. The first conductive layer, the barrier conductive layer and the second conductive layer may be formed by, e.g., a sputtering process, a PVD process, CVD process, or an ALD process.

The mask pattern 358 may include, e.g., silicon nitride, and may extend in the second direction. A width of the mask pattern 358 (e.g., a width in the first direction) may be less than that of the groove 345.

The second conductive layer, the barrier conductive layer and the first conductive layer may be sequentially etched using the mask pattern 358 as an etching mask. Accordingly, a first conductive pattern 352, a barrier conductive pattern 354 and a second conductive pattern 356 may be sequentially formed on the first impurity region 308a.

After performing the processes as described above, the conductive line structure 350 including the first conductive pattern 352, the barrier conductive pattern 354, the second conductive pattern 356 and the mask pattern 358 may be formed. The conductive line structure 350 may extend in the second direction on the first impurity regions 308a. In example embodiments, the conductive line structure 350 may serve as a bit line of a DRAM device.

As illustrated in FIG. 20, a width of the conductive line structure 350 may be less than that of the groove 345.

In some embodiments, a spacer 355 may be formed on a sidewall of the conductive line structure 350. For example, a spacer layer covering the conductive line structure 350 may be formed on the capping layer 320. The spacer layer may be anisotropically etched to form the spacer 355. The spacer layer may be formed of, e.g., silicon nitride.

Figure 21:
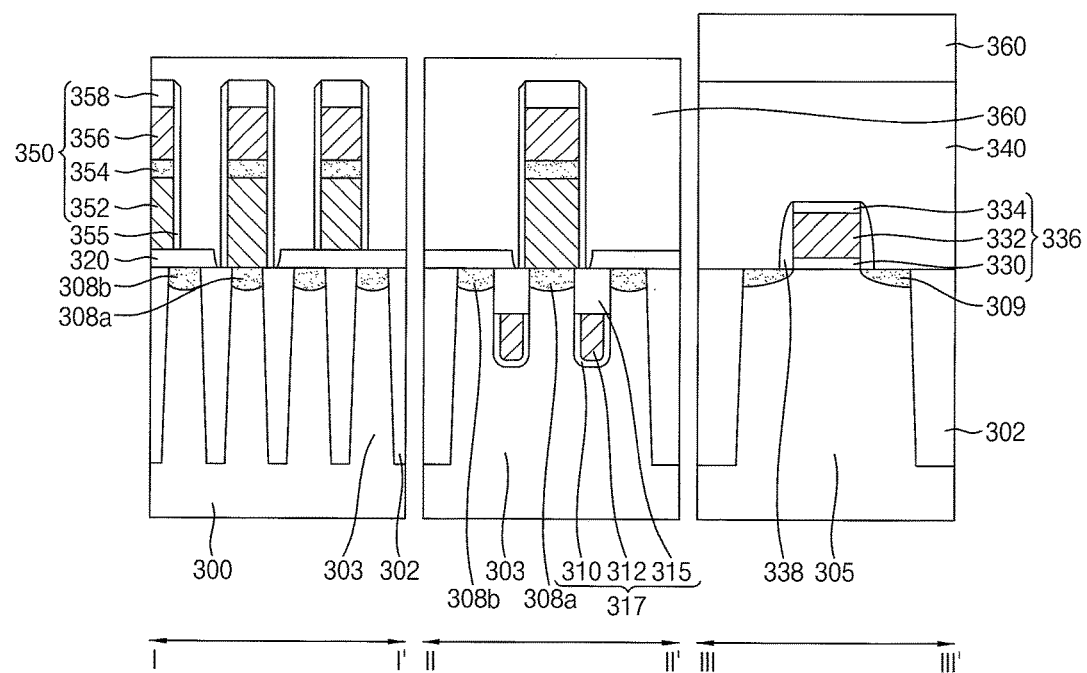

Referring to FIG. 21, an organic insulating interlayer 360 covering the conductive line structures 350 may be formed on the capping layer 320 and the peripheral circuit protection layer 340.

The organic insulating interlayer 360 may fill a space between the conductive line structures 350 at the first region A, and may cover the mask patterns 358. The organic insulating interlayer 360 may extend on the peripheral circuit protection layer 340 at the second region B. The organic insulating interlayer 360 may have a stepped portion or a protrusion at the second region B.

In example embodiments, the organic insulating interlayer 360 may be formed using an organic material such as a polysiloxane-based material, a polysilazane-based material or a carbon-based SOH material by a spin coating process.

Figure 22:
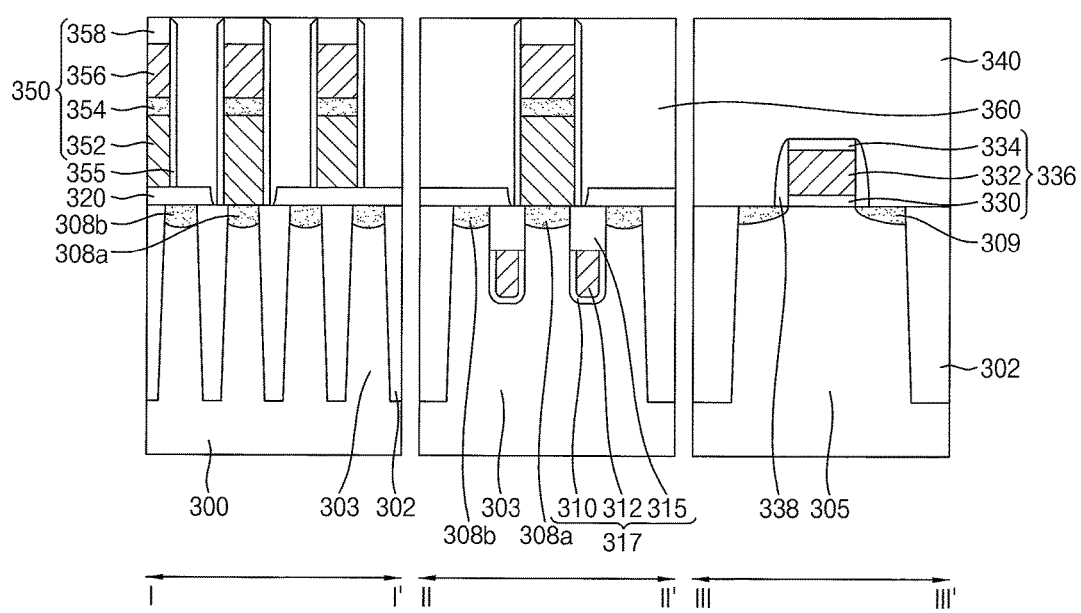

Referring to FIG. 22, an upper portion of the organic insulating interlayer 360 may be planarized by a CMP process using a polishing composition. The mask pattern 358 and/or the peripheral circuit protection layer 340 may substantially serve as a polish-stop layer.

The polishing composition used in the process described with reference to FIG. 4 may be utilized in the CMP process. As described above, the polishing composition may be devoid of abrasive particles, and may include an oxidizing agent, a surfactant, a pH adjusting agent and/or a polishing accelerator. Thus, the organic insulating interlayer 360 having a substantially leveled or planar top surface and being free of defects such as scratches or dimples may be obtained. The CMP process using the polishing composition may be performed with a polishing time, a polishing pressure and/or a polishing plate rotating speed greater than those for a CMP process using the abrasive particles.

In some embodiments, a thermal treatment may be further performed on the organic insulating interlayer 360. In this case, the organic insulating interlayer 360 may be substantially transformed into a silicate structure.

Figure 23:
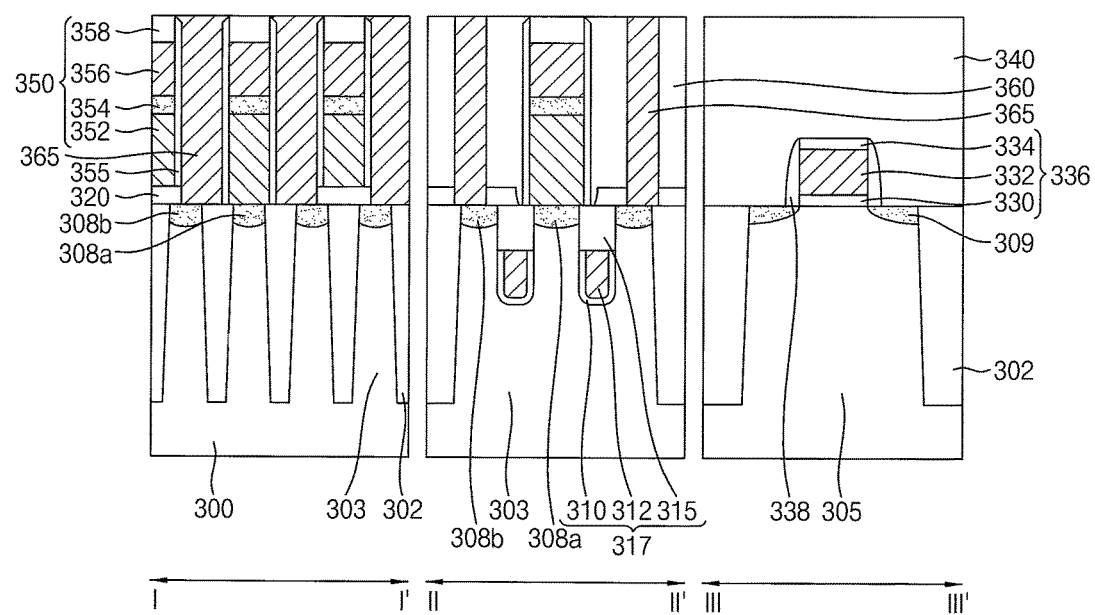

Referring to FIG. 23, a first contact 365 electrically connected to the second impurity region 308b may be formed.

In example embodiments, the organic insulating interlayer 360 and the capping layer 320 may be partially etched to form first contact holes through which the second impurity region 308b may be at least partially exposed. For example, two of the first contact holes may be formed on one of the first active patterns 303.

A conductive layer filling the first contact holes may be formed, and an upper portion of the conductive layer may be planarized by a CMP process until a top surface of the mask pattern 358 may be exposed. Accordingly, the first contact 365 may be formed in each first contact hole, and may be in contact with the second impurity region 308b.

The conductive layer may be formed using a metal such as copper or tungsten by a sputtering process, a PVD process, an ALD process, or a CVD process.

Figure 24:
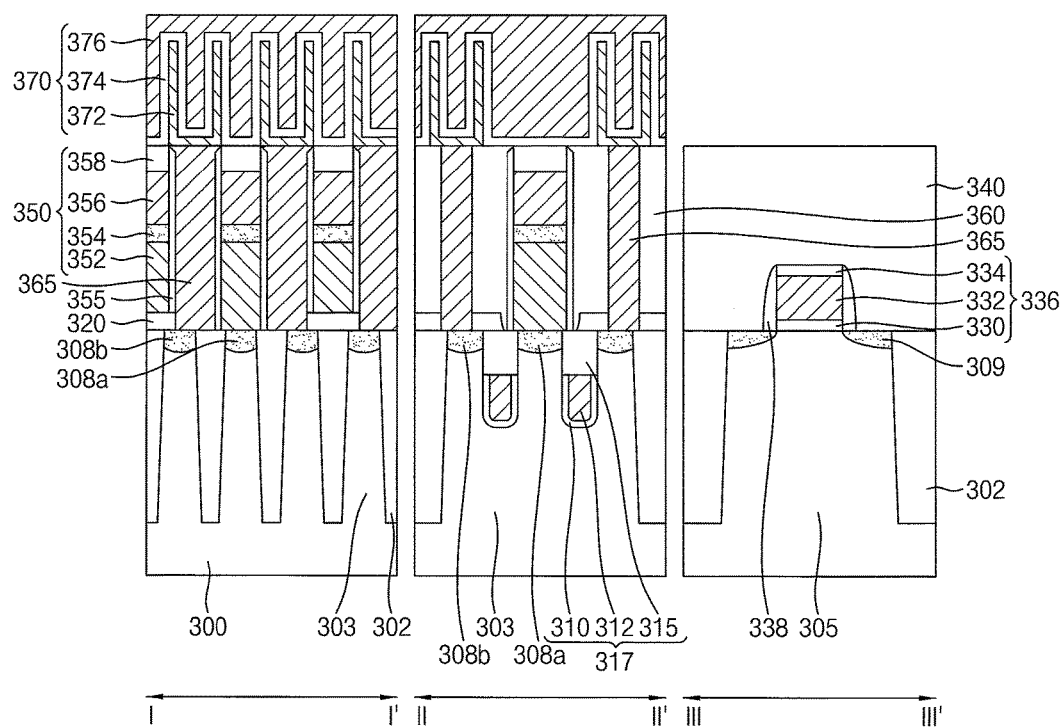

Referring to FIG. 24, a capacitor 370 may be formed on the first contact 365.

For example, an etch-stop layer (not illustrated) may be formed on the organic insulating interlayer 360, the mask pattern 358 and the first contact 365 at the first region A, and a mold layer (not illustrated) may be formed on the etch-stop layer. The mold layer and the etch-stop layer may be partially removed to form an opening through which a top surface of the first contact 365 may be exposed.

A lower electrode layer may be formed along an inner wall of the opening and a top surface of the mold layer. A sacrificial layer (not illustrated) may be formed on the lower electrode layer, and upper portions of the sacrificial layer and the lower electrode layer may be planarized such that the top surface of the mold layer may be exposed. The sacrificial layer and the mold layer may be removed to form a lower electrode 372. The sacrificial layer and the mold layer may be formed of silicon oxide, and may be removed using an etchant solution that may include fluoric acid.

A dielectric layer 374 may be formed on surfaces of the etch-stop layer and the lower electrode 372, and an upper electrode layer may be formed on the dielectric layer 374. Portions of the dielectric layer 374 and the upper electrode layer formed at the second region B may be removed to form an upper electrode 376 at the first region A The lower and upper electrode layers may be formed of a metal and/or a metal nitride by a sputtering process, an ALD process, a PVD process, or the like. The dielectric layer 374 may be formed of a metal oxide having a high dielectric constant (high-k), e.g., hafnium oxide (HfOx), zirconium oxide (ZrOx) or aluminum oxide (AlOx) by a CVD process or an ALD process.

Accordingly, the capacitor 370 including the lower electrode 372, the dielectric layer 374 and the upper electrode 376 may be formed at the first region A.

Figure 25:
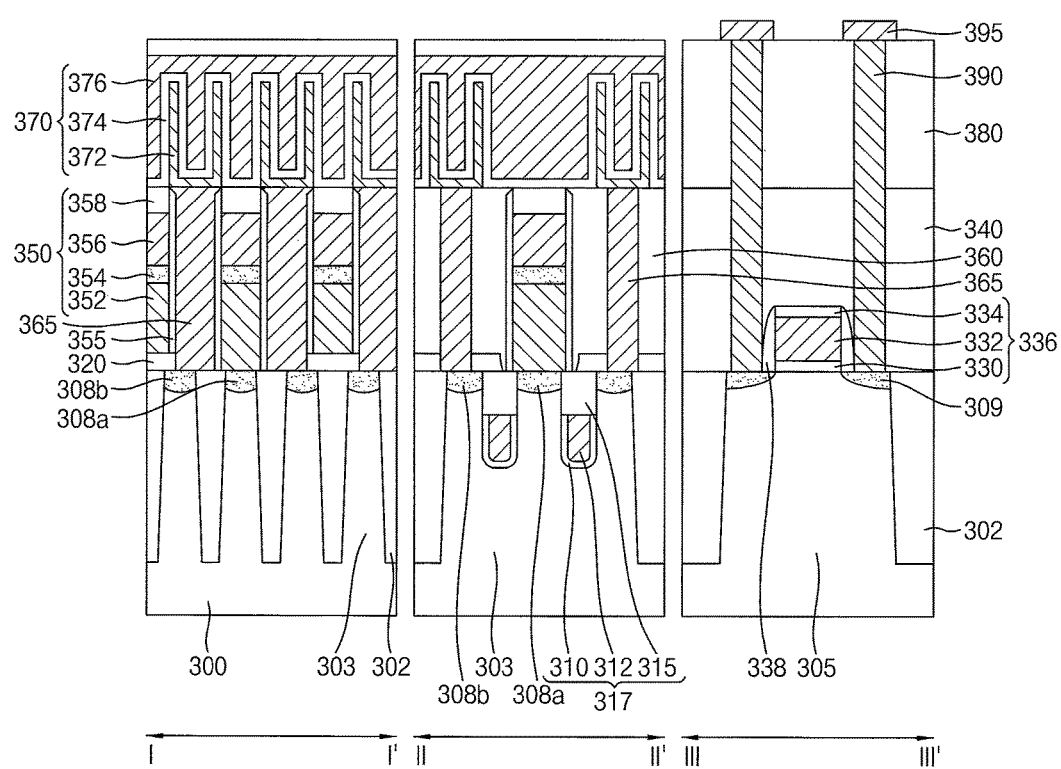

Referring to FIG. 25, an insulating interlayer 380 covering the capacitors 370 may be formed on the peripheral circuit protection layer 340. The insulating interlayer 380 may substantially cover the first region A and the second region B. In some embodiments, the insulating interlayer 380 may entirely cover the first region A and the second region B. Additionally, an upper portion of the insulating interlayer 380 may be planarized by a CMP process. The CMP process may be performed using a polishing composition that may include abrasive particles.

A second contact 390 and a wiring 395 electrically connected to the peripheral circuit transistor may be formed at the second region B of the substrate 300. For example, a second contact hole exposing the third impurity region 309 may be formed through the insulating interlayer 380 and the peripheral circuit protection layer 340. A conductive layer filling the second contact hole may be formed on the insulating interlayer 380, and an upper portion of the conductive layer may be planarized to form the second contact that may be in contact with the third impurity region 309. The wiring 395 electrically connected to the second contact 390 may be formed on the insulating interlayer 380. The second contact 390 and the wiring 395 may serve as a portion of peripheral circuits.

In some embodiments, a passivation layer including silicon nitride may be further formed on the capacitor 370.

As described above, the polishing process according to example embodiments may be implemented for forming an isolation layer, an organic insulating interlayer, etc., of a DRAM device to improve reliability of an insulation structure.

According to example embodiments of the present inventive concepts, a polishing composition devoid of abrasive particles may be used for a polishing process with respect to an organic layer including, e.g., an SOH material. Thus, defects of the organic layer such as scratches, dimples, delamination, etc., may be suppressed due to the abrasive particles. A polishing pressure, a pad rotating rate and/or a polishing time may be increased compared to those for a conventional CMP process using the abrasive particles so that a polishing amount reduction due to a lack of the abrasive particles may be compensated.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
   forming mask patterns on a semiconductor substrate;
   forming an organic layer on the semiconductor substrate to cover the mask patterns;
   planarizing an upper portion of the organic layer using a polishing composition, the polishing composition including an oxidizing agent and being devoid of abrasive particles;
   forming an object layer on the semiconductor substrate before forming the mask patterns, wherein forming the mask patterns includes forming first organic layer patterns on the object layer and forming spacers on sidewalls of the first organic layer patterns, wherein the organic layer fills spaces between the spacers and planarizing the upper portion of the organic layer includes forming second organic layer patterns between the spacers;
   removing the spacers after forming the second organic layer patterns to form openings; and
   etching the object layer through the openings.

2. The method of claim 1, wherein the organic layer is formed of at least one of a polysilazane-based material, a polysiloxane-based material or a spin-on hardmask (SOH) material.

3. The method of claim 1, wherein the polishing composition further includes at least one of a surfactant, a pH adjusting agent or a polishing accelerator.

4. The method of claim 3, wherein the polishing composition is devoid of a dispersing agent for abrasive particles.

5. The method of claim 1, further comprising etching an upper portion of the semiconductor substrate using the mask patterns to form a trench,
   wherein the organic layer fills the trench.

6. The method of claim 1, wherein at least a portion of the mask patterns serves as a bulk mask, and the organic layer includes a stepped portion protruding on the bulk mask.

* * * * *